(12) United States Patent
Watanabe et al.

(10) Patent No.: US 9,431,321 B2
(45) Date of Patent: Aug. 30, 2016

(54) METHOD OF MANUFACTURING A SEMICONDUCTOR DEVICE AND SEMICONDUCTOR INTEGRATED CIRCUIT WAFER

(71) Applicant: KABUSHIKI KAISHA TOSHIBA, Minato-ku, Tokyo (JP)

(72) Inventors: Shinya Watanabe, Oita (JP); Kazuyuki Higashi, Oita (JP); Taku Kamoto, Oita (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/317,648

(22) Filed: Jun. 27, 2014

(65) Prior Publication Data

US 2015/0255373 A1 Sep. 10, 2015

Related U.S. Application Data

(60) Provisional application No. 61/950,576, filed on Mar. 10, 2014.

(30) Foreign Application Priority Data

Mar. 14, 2014 (JP) ................... 2014-052071

(51) Int. Cl.
*H01L 23/544* (2006.01)
*H01L 23/48* (2006.01)
(Continued)

(52) U.S. Cl.
CPC ......... *H01L 23/481* (2013.01); *H01L 21/6835* (2013.01); *H01L 21/76898* (2013.01);
(Continued)

(58) Field of Classification Search
CPC ................. H01L 24/05; H01L 2224/05548; H01L 2224/0392; H01L 2924/1305; H01L 22/34; H01L 22/30; H01L 22/32
See application file for complete search history.

(56) References Cited

U.S. PATENT DOCUMENTS 8,810,006 B2    8/2014   Yu et al.
2007/0275539 A1* 11/2007  Rashid ............... G01R 31/2884
                                          438/460

(Continued)

FOREIGN PATENT DOCUMENTS

JP    2002176140 A    6/2002
JP    2011171356 A    9/2011

(Continued)

OTHER PUBLICATIONS

Taiwanese Office Action (and English translation thereof) dated Mar. 21, 2016, issued in counterpart Taiwanese Application No. 103128299.

*Primary Examiner* — Jerome Jackson, Jr.
*Assistant Examiner* — Mohammed R Alam
(74) *Attorney, Agent, or Firm* — Holtz, Holtz & Volek PC (57) ABSTRACT

According to one embodiment, a method of manufacturing a semiconductor device comprises forming through holes extending through a semiconductor substrate in a thickness direction to integrated circuits in chip areas, and forming a first mark opening and second mark openings in a dicing line. The method detects the first mark opening based on positions of the second mark openings. Then, the method performs alignment of exposure positions based on the position of the first mark opening to perform photolithography, thereby forming a resist pattern on the back side of the semiconductor substrate.

12 Claims, 11 Drawing Sheets

(51) Int. Cl.
*H01L 21/768* (2006.01)
*H01L 23/538* (2006.01)
*H01L 21/82* (2006.01)
*H01L 21/683* (2006.01)
*H01L 21/66* (2006.01)
*H01L 23/00* (2006.01)

(52) U.S. Cl.
CPC ............... *H01L21/82* (2013.01); *H01L 22/34* (2013.01); *H01L 23/5386* (2013.01); *H01L 23/544* (2013.01); *H01L 24/73* (2013.01); *H01L 24/94* (2013.01); *H01L 24/03* (2013.01); *H01L 24/05* (2013.01); *H01L 24/11* (2013.01); *H01L 24/13* (2013.01); *H01L 2221/6834* (2013.01); *H01L 2221/68327* (2013.01); *H01L 2223/5446* (2013.01); *H01L 2223/54426* (2013.01); *H01L 2224/05009* (2013.01); *H01L 2224/0557* (2013.01); *H01L 2224/05155* (2013.01); *H01L 2224/05644* (2013.01); *H01L 2224/1145* (2013.01); *H01L 2224/1146* (2013.01); *H01L 2224/11472* (2013.01); *H01L 2224/131* (2013.01); *H01L 2224/13009* (2013.01); *H01L 2224/13014* (2013.01); *H01L 2224/13025* (2013.01); *H01L 2224/13082* (2013.01); *H01L 2224/13147* (2013.01); *H01L 2224/13155* (2013.01); *H01L 2224/73151* (2013.01); *H01L 2224/94* (2013.01); *H01L 2924/14* (2013.01)

(56) References Cited

U.S. PATENT DOCUMENTS

| | | |
|---|---|---|
| 2010/0200957 A1 | 8/2010 | Chandrasekaran |
| 2011/0133333 A1* | 6/2011 | Kwon ............... H01L 21/76898 257/737 |
| 2014/0042643 A1 | 2/2014 | Yu et al. |
| 2014/0264885 A1* | 9/2014 | Tsai ..................... H01L 23/544 257/769 |
| 2015/0137382 A1* | 5/2015 | Yang .................... H01L 23/481 257/774 |

FOREIGN PATENT DOCUMENTS

| | | |
|---|---|---|
| JP | 2012517111 A | 7/2012 |
| TW | 201407750 A | 2/2014 |
| WO | 2010091245 A8 | 8/2010 |

* cited by examiner

METHOD OF MANUFACTURING A SEMICONDUCTOR DEVICE AND SEMICONDUCTOR INTEGRATED CIRCUIT WAFER

CROSS-REFERENCE TO RELATED APPLICATIONS

This application is based upon and claims the benefit of priority from U.S. Provisional Application No. 61/950,576, filed on Mar. 10, 2014; and Japanese Patent Application No. 2014-052071, filed on Mar. 14, 2014; the entire contents all of which are incorporated herein by reference.

FIELD

Embodiments described herein relate generally to a method of manufacturing a semiconductor device, and a semiconductor integrated circuit wafer.

BACKGROUND

Conventionally, there has been a technology which stacks multiple semiconductor chips having integrated circuits formed thereon and electrically connects the semiconductor chips by TSVs (Through Silicon Vias) to reduce the footprint of the semiconductor device. In the manufacture of semiconductor chips, multiple chip areas with dicing lines in between are formed in a semiconductor wafer. Then, after their electrical characteristics are inspected, the semiconductor wafer is cut along the dicing lines, thereby being divided into semiconductor chips. For semiconductor wafers, it is important to secure the gross quantity in order to improve the yield, but it is also important to secure an area for inspection.

In the photolithography used in the manufacture of semiconductor chips, there is desired the quick alignment of exposure positions without causing the occurrence of a crack in a dicing line and an influence on the characteristics of semiconductor chips.

DETAILED DESCRIPTION

In general, according to one embodiment, a method of manufacturing a semiconductor device comprises forming through holes extending through a semiconductor substrate in a thickness direction to integrated circuits in multiple chip areas having the integrated circuits formed on one side in the semiconductor substrate and forming a first mark opening and second mark openings extending through the semiconductor substrate in a thickness direction and placed in neighboring areas of the first mark opening in dicing lines separating the chip areas from each other in the semiconductor substrate. Then, the method detects the first mark opening based on positions of the second mark openings and performs alignment of exposure positions based on the position of the first mark opening to perform photolithography, thereby forming a resist pattern having first openings, through which regions respectively having the through holes inside are exposed at the back side of the semiconductor substrate, on the back side of the semiconductor substrate. Then, the method fills conductive material into the through holes and removes the resist pattern.

Exemplary embodiments of the method of manufacturing a semiconductor device, and a semiconductor integrated circuit wafer will be explained below in detail with reference to the accompanying drawings. The present invention is not limited to the following embodiments. In the figures cited below, the scale for each member may be different for easiness of understanding, and the same is true of the same member in the different figures. Further, plan views may also be partially hatched for easiness of viewing.

Figure 1:
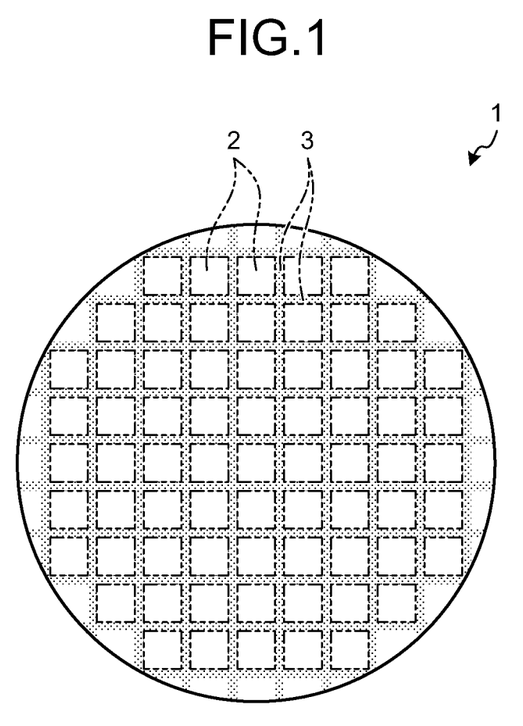
FIG. 1 is a plan view of a semiconductor wafer according to an embodiment as seen from the back side.

FIG. 1 is a plan view of a semiconductor integrated circuit wafer 1 according to the embodiment as seen from the back side. In the semiconductor integrated circuit wafer 1, multiple chip areas 2 are formed in a matrix, being separated from each other by dicing lines. The semiconductor integrated circuit wafer 1 is cut along the dicing lines 3, thereby separating the multiple chip areas 2 respectively into semiconductor chips (semiconductor devices).

Figure 2A:
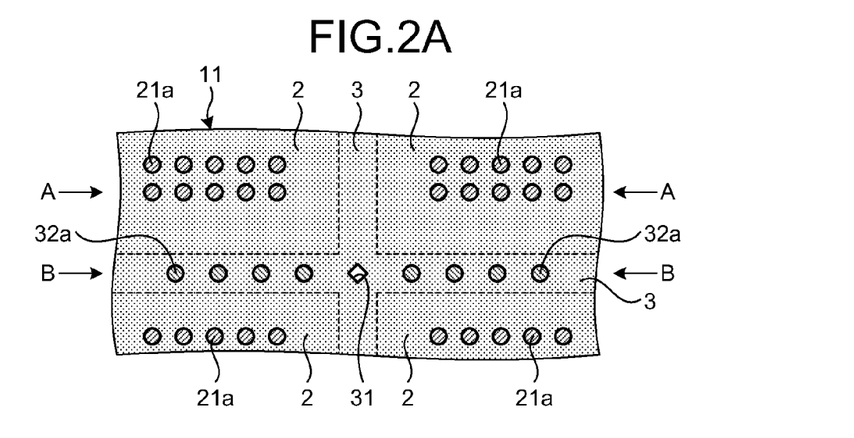
FIGS. 2A to 2D are diagrams showing the structure of the semiconductor wafer according to the embodiment.
Figure 2B:
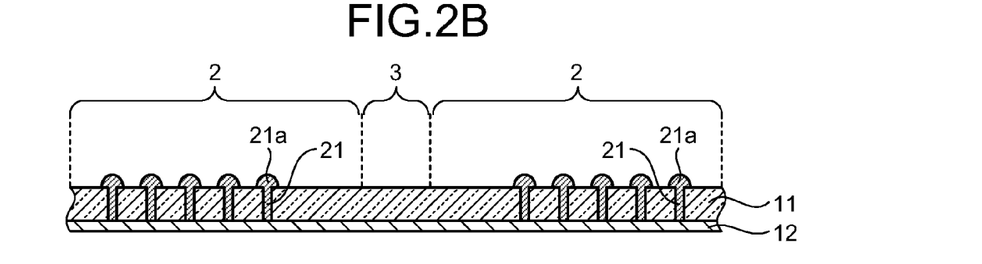
Figure 2C:
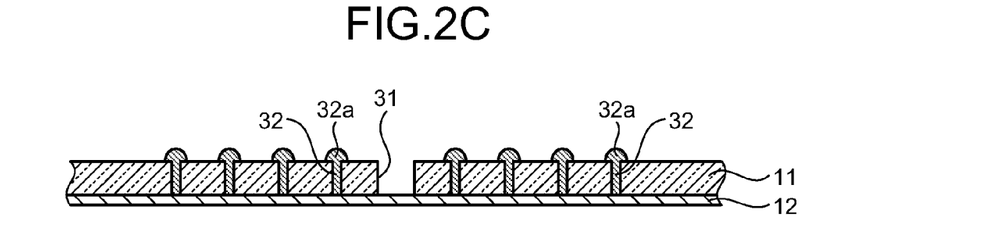
Figure 2D:
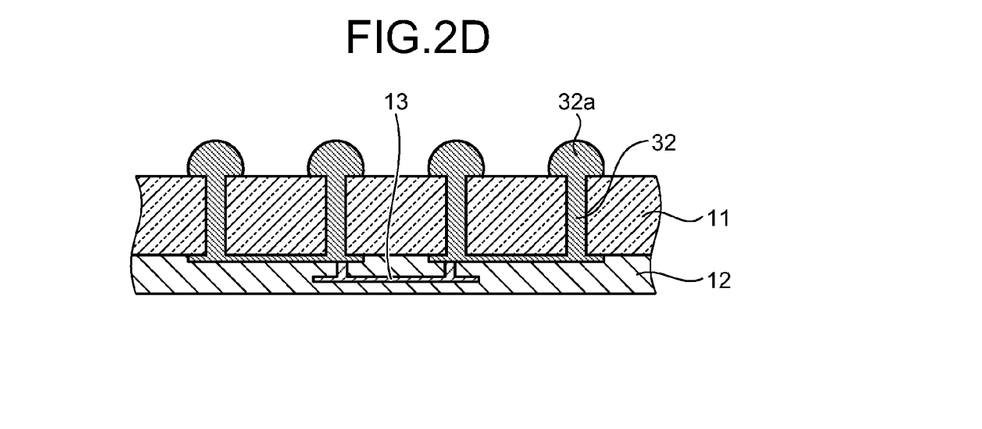

FIGS. 2A to 2D are diagrams showing the structure of the semiconductor integrated circuit wafer 1 according to the embodiment. FIG. 2A is an enlarged main part view of the back surface of the semiconductor integrated circuit wafer 1. FIG. 2B is a main-part cross-sectional view of chip areas 2 of the semiconductor integrated circuit wafer 1 and a cross-sectional view along line A-A in FIG. 2A. FIG. 2C is a main-part cross-sectional view of a dicing line 3 of the semiconductor integrated circuit wafer 1 and a cross-sectional view along line B-B in FIG. 2A. FIG. 2D is an enlarged main part view of the cross-section of the dicing line 3. Note that FIGS. 2B to 2D show the state where the front side of the semiconductor integrated circuit wafer 1 faces downward. Hereinafter the front side of the semiconductor integrated circuit wafer 1 or a semiconductor substrate 11 refers to the surface having a circuit layer 12, described later, provided thereon. The back side of the semiconductor integrated circuit wafer 1 or the semiconductor substrate 11 refers to the surface opposite to the front side of the semiconductor integrated circuit wafer 1 or the semiconductor substrate 11.

In the semiconductor integrated circuit wafer 1, a circuit layer 12 having integrated circuits including upper electrode pads and circuit elements formed therein is provided on one side (the front side) of the semiconductor substrate 11. The circuit layer 12 may be provided to be formed of separate portions as needed.

Vias 21 having exposed bumps 21a protruding from the back side of the semiconductor integrated circuit wafer 1 are provided in chip areas 2 in the back side of the semiconductor integrated circuit wafer 1. The vias 21 are provided extending through the semiconductor substrate 11 in a thickness direction. When semiconductor chips into which the chip areas 2 are separated respectively are stacked in multiple stages, the vias 21 are through silicon vias (TSVs) for electrically connecting the integrated circuit that the semiconductor chip of the lower stage comprises and the integrated circuit that the semiconductor chip of the upper stage comprises. The vias 21 are formed of, e.g., nickel. The bumps may be, e.g., copper and solder laid over each other.

A circuit layer 12 of the dicing lines 3 is a for-test circuit layer in which for-test circuit elements 13 as a TEG (Test Element Group) are formed. In the TEG (for-test circuit elements 13), there are provided a plurality of independent circuit patterns for indirectly inspecting the electrical characteristics such as the electrical characteristics of the integrated circuits provided in the chip areas 2, those of TSVs (vias 21) formed in the chip areas, and those of a daisy-chain connection of semiconductor integrated circuit wafers 1 stacked in multiple stages.

An opening 31 and for-test vias 32 having exposed bumps 32a protruding from the back side of the semiconductor integrated circuit wafer 1 are provided in the dicing line 3 in the back side of the semiconductor integrated circuit wafer 1. The opening 31 is used as an alignment mark in the manufacture of the semiconductor integrated circuit wafer 1 as described later.

The for-test vias 32 are through silicon vias (TSVs) extending through the semiconductor substrate 11 in a thickness direction to connect to the for-test circuit elements 13 as shown in FIGS. 2C and 2D. The for-test vias 32 are used in the inspection of the above electrical characteristics using the for-test circuit elements 13. Also, the for-test vias 32 are used to electrically connect the for-test circuit elements 13 that the semiconductor integrated circuit wafer 1 of the lower stage comprises and the for-test circuit elements 13 that the semiconductor integrated circuit wafer 1 of the upper stage comprises, when stacking semiconductor integrated circuit wafers 1 in multiple stages to form a daisy-chain connection. The for-test vias 32 are formed of, e.g., nickel. The bumps may be, e.g., copper and solder laid over each other.

When the semiconductor integrated circuit wafer 1 is cut along the dicing lines 3 to separate the multiple chip areas 2 respectively into chips, almost the entire dicing lines 3 disappear, although whether it actually happens depends on the width of the dicing lines 3 and the width of the dicing blade. Thus, when the chip areas 2 are separated respectively into chips, the opening 31 and for-test vias 32 also disappear.

Next, a manufacturing process of the semiconductor integrated circuit wafer 1 according to the embodiment will be described. FIGS. 3A to 7C are diagrams showing the manufacturing process of the semiconductor integrated circuit wafer 1 according to the embodiment. In FIGS. 3A to 7C, FIG. XA (X are integers of from 3 to 7) are plan views; FIG. XB (X are integers of from 3 to 7) are cross-sectional views along line A-A in FIG. XA; and FIG. XC (X are integers of from 3 to 7) are cross-sectional views along line B-B in FIG. XA.

Figure 3A:
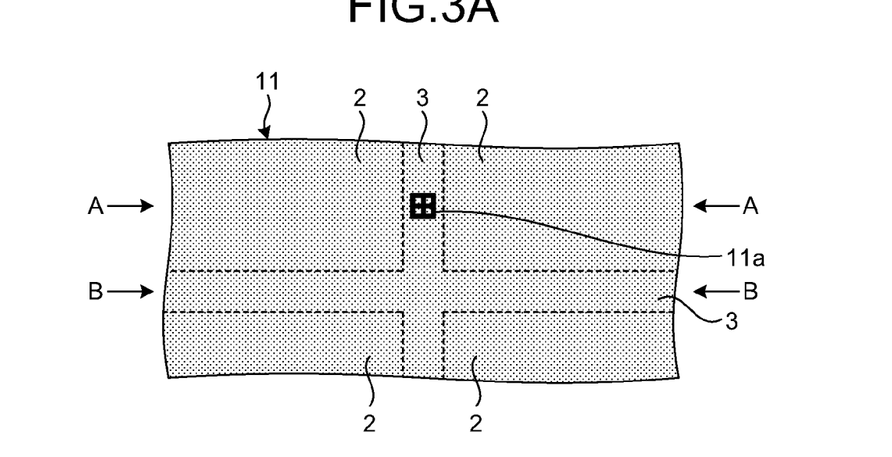
FIGS. 3A to 3C are diagrams showing a manufacturing process of the semiconductor wafer according to the embodiment.
Figure 3B:
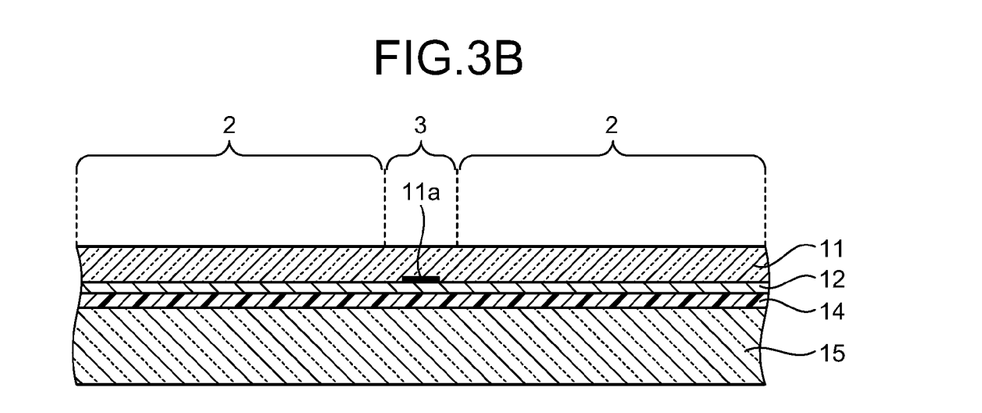
Figure 3C:
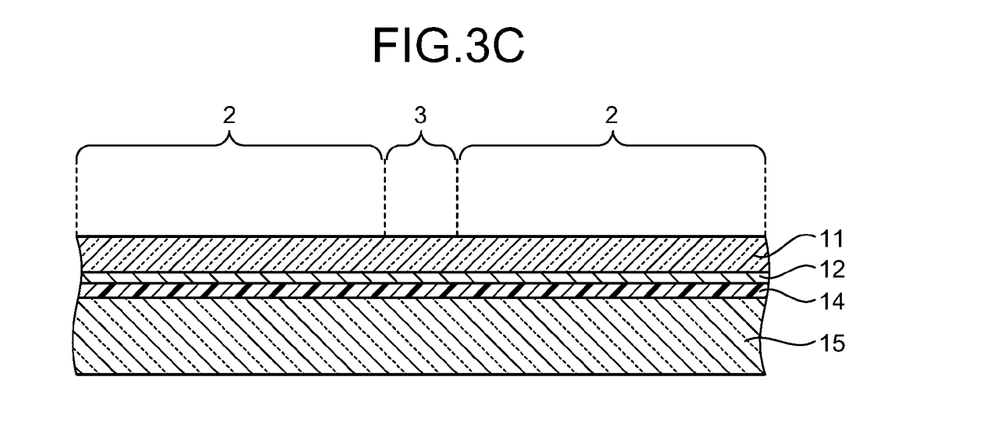

In the manufacture of the semiconductor integrated circuit wafer 1, after coating a resin-based adhesive on the front side of the semiconductor substrate 11 having the circuit layer 12 formed thereon to form an adhesive layer 14, a support substrate 15 is stuck on the upper surface of the adhesive layer 14. The circuit layer 12 has a thickness of, e.g., about 3 μm. Then, by polishing the back side of the semiconductor substrate 11 by, e.g., CMP, the semiconductor substrate 11 is made thinner (FIGS. 3A to 3C). The semiconductor substrate 11 is made thinner down to a thickness at which through holes can be formed in the semiconductor substrate 11.

Here, integrated circuits are formed in the circuit layer 12 on the chip areas 2, and the for-test circuit elements 13 are formed in the circuit layer 12 on the dicing lines 3. The thickness of the adhesive layer 14 is, for example, about 50 μm. For example, a silicon substrate or a glass substrate is used as the support substrate 15.

Next, through holes extending from the back side of the semiconductor substrate 11 through the semiconductor substrate 11 in a thickness direction to the integrated circuits formed in the chip areas 2 by photolithography and etching. First, for example, a silicon oxide film, a silicon nitride film, and a silicon oxide film (not shown) are formed as an insulating layer over the back side of the semiconductor substrate 11. Then, after coating a resist 41 over the back side of the semiconductor substrate 11, exposure and development are performed to form openings 22 in, e.g., a circular shape that extend through the resist 41 in a thickness direction to the back side of the semiconductor substrate 11 in the resist 41 over the chip areas (FIGS. 4A, 4B).

Alignment in exposure of the resist 41 is performed using an alignment mark 11a that was formed in the semiconductor substrate 11 beforehand when the integrated circuits were formed. Although in the plan views of FIGS. 3A and 4A, the alignment mark 11a is shown for easiness of understanding, the alignment mark 11a cannot be seen visually. Accordingly, alignment of exposure positions (positions of a photomask) in exposure of the resist 41 is performed based on the alignment mark 11a, with seeing through from the back side of the semiconductor substrate 11 by, e.g., an infrared microscope to observe the alignment mark 11a.

Figure 4A:
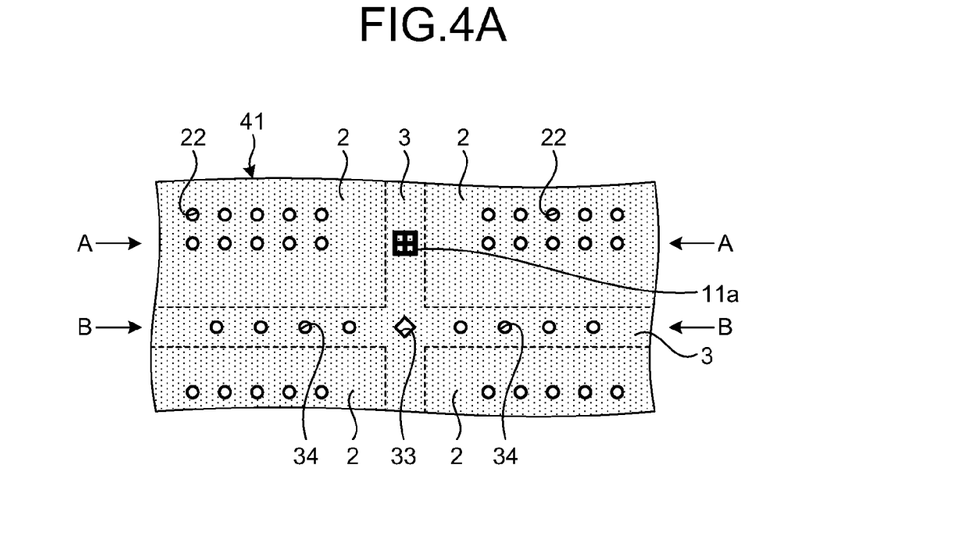
FIGS. 4A to 4C are diagrams showing the manufacturing process of the semiconductor wafer according to the embodiment.
Figure 4B:
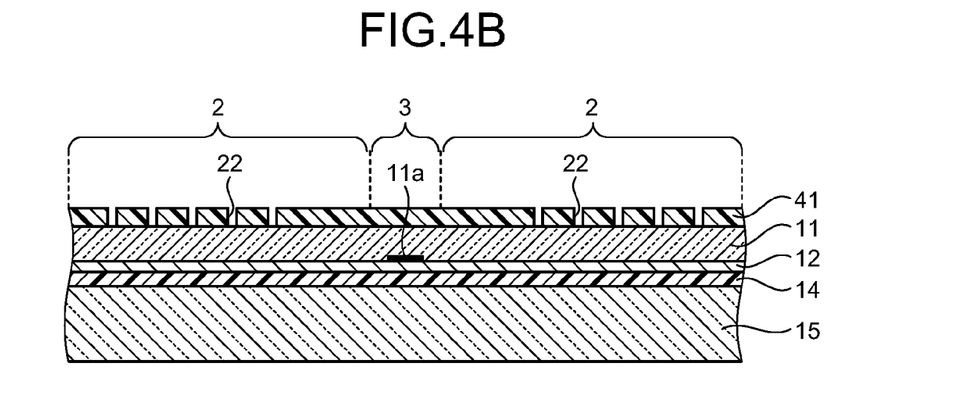
Figure 4C:
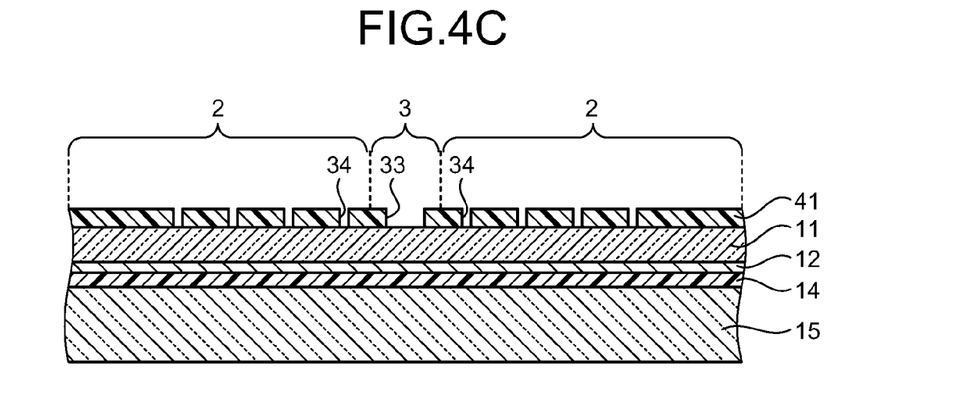

When forming the openings 22, a first mark opening 33 and second mark openings 34 constituted by through holes that extend through the resist 41 in a thickness direction to the back side of the semiconductor substrate 11 are formed by exposure and development on the dicing lines 3 simultaneously with the openings 22 (FIGS. 4A, 4C). Thus, a mask pattern (resist pattern) for etching the back side of the semiconductor substrate 11 is formed.

The first mark opening 33 is an alignment mark used for alignment of exposure positions (positions of a photomask) when exposing a resist 42 described later. A plurality of the first mark openings 33 are formed in intersection regions of the dicing lines 3 intersecting along a plane direction of the semiconductor substrate 11. The forming positions of the first mark openings 33 in the dicing lines 3 are not limited to the intersection regions. The shape of the first mark openings 33 is not limited to a specific one as long as alignment when exposing the resist 42 is possible therewith. The size of the first mark opening 33 along a plane direction of the semiconductor substrate 11 is not limited to a specific one as long as alignment when exposing the resist 42 is possible therewith and is set at, e.g., 30 to 40 µm from the viewpoint of alignment accuracy.

The second mark openings 34 are lead marks for detecting the first mark opening 33 when exposing the resist 42. When exposing the resist 42, alignment is performed based on the first mark opening 33 with use of a usual microscope not using infrared. In order to detect the first mark opening 33, coordinate positions where first mark openings 33 are formed are set in the microscope, and the neighborhood of the coordinate position is searched for the first mark opening 33. However, in order to prevent the occurrence of a crack in a dicing line 3 and an influence on the characteristics of semiconductor chips when dicing, the number of first mark openings 33 is required to be a minimum necessary number to be able to align. Hence, it is difficult to detect a first mark opening 33 on the back side of the semiconductor substrate 11, and thus it takes time to detect a first mark opening 33.

Accordingly, in the present embodiment, the second mark openings 34 are formed near the first mark opening 33 along a plane direction of the semiconductor substrate 11 on a dicing line 3. When exposing the resist 42, if the first mark opening 33 itself cannot be directly detected, then by searching the vicinity of the detected second mark openings 34, the first mark opening 33 can be easily detected in a short time. By increasing the number of formed second mark openings 34, the second mark openings 34 can be detected more easily. As a result, the exposure process can be efficiently performed, thus improving productivity in manufacturing the semiconductor integrated circuit wafer 1.

The second mark openings 34 are formed in plurality near the first mark opening 33 along a plane direction of the semiconductor substrate 11 on a dicing line 3. The shape of the second mark openings 34 may be any one as long as they can be detected when exposing the resist 42 and is, for example, a circle. The size of the second mark openings 34 along a plane direction of the semiconductor substrate 11 may be any one as long as they can be detected when exposing the resist 42 and is, for example, about 10 µm. In order to avoid the occurrence of a crack in a dicing line 3 and an influence on the characteristics of semiconductor chips when dicing, the size of the second mark openings 34 is set smaller than the size of the first mark opening 33. Further, the size of the second mark openings 34 is set at such a size that the openings are reliably formed in etching the semiconductor substrate 11 with the resist 41 as an etching mask.

The second mark openings 34 are formed different in at least one of the shape and size from the first mark opening 33. If the second mark openings 34 had the same shape and the same size as the first mark opening 33, the same situation as a situation would occur where a plurality of first mark openings 33 exist near the region where the first mark opening 33 is formed, and thus a crack in a dicing line 3 and an adverse influence on the characteristics of semiconductor chips would occur in alignment when exposing, and when dicing.

Figure 8A:
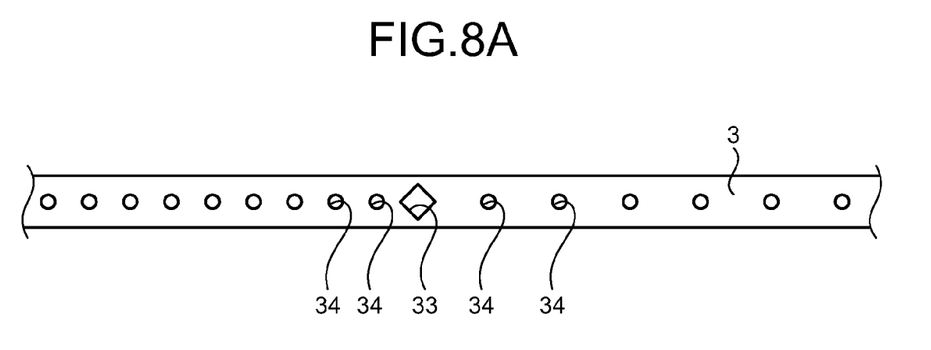
FIGS. 8A and 8B are diagrams showing an example where second mark openings are formed in a dicing line according to the embodiment.
Figure 8B:
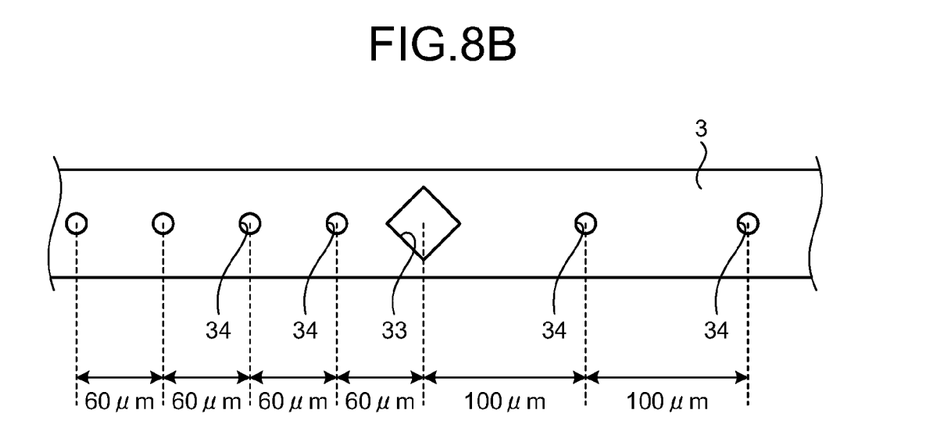

The second mark openings 34 are formed in plurality along a direction in which a dicing line 3 extends, e.g., at predetermined pitches. The pitch at which the second mark openings 34 are formed is the same for, e.g., two opposite regions of the dicing line 3 with the first mark opening 33 in between (FIGS. 4A, 4C). The pitch at which the second mark openings 34 are formed may be different for two opposite regions of the dicing line 3 with the first mark opening 33 in between as shown in, e.g., FIGS. 8A and 8B. FIGS. 8A and 8B are diagrams showing an example where the second mark openings 34 are formed in a dicing line 3. FIG. 8B is an enlarged main part view of FIG. 8A.

By setting the formation pitch of the second mark openings 34 to be different for two opposite regions of the dicing line 3 with the first mark opening 33 in between, the detected formation pitch of the second mark openings 34 can indicate the direction in which the first mark openings 33 exists. In the example of FIG. 8B, when the detected formation pitch of the second mark openings 34 is 100 µm, it is seen that the first mark opening 33 is to the left along an extending direction of the dicing line 3 on which the second mark openings 34 exist. When the detected formation pitch of the second mark openings 34 is 60 µm, it is seen that the first mark opening 33 is to the right along an extending direction of the dicing line 3 on which the second mark openings 34 exist. Thus, after detecting second mark openings 34, the first mark opening 33 can be detected more easily in a short time.

If the first mark opening 33 is formed on an intersection region of intersecting dicing lines 3, the second mark openings 34 may be formed along extending directions of the dicing lines 3, in four directions going out from the intersection region as the center. Thus, the second mark openings 34 are detected more easily, and therefore the first mark opening 33 can be detected more easily in a short time. Further, the formation pitch of the second mark openings 34 may be set different for the four directions of the dicing lines 3. Thus, the second mark openings 34 are detected more easily, and therefore the first mark opening 33 can be detected more easily in a short time.

Figure 5A:
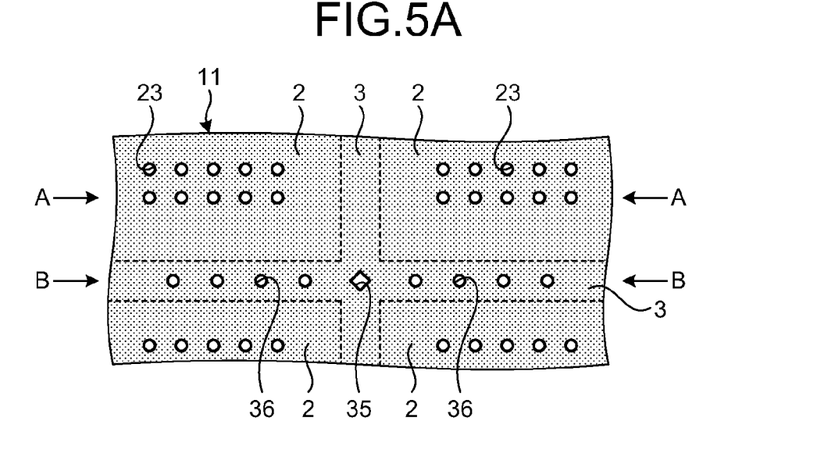
FIGS. 5A to 5C are diagrams showing the manufacturing process of the semiconductor wafer according to the embodiment.
Figure 5B:
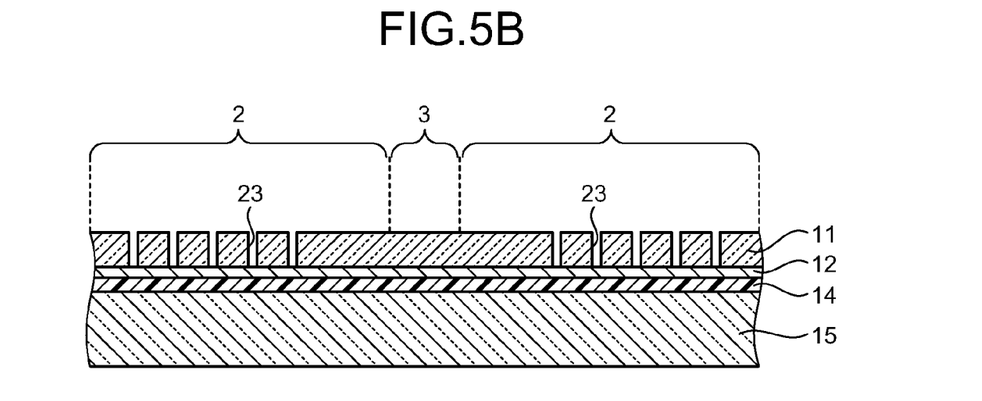

Next, anisotropic dry etching such as reactive ion etching (RIE) is performed from the back side of the semiconductor substrate 11 toward the circuit layer 12 with the mask pattern (resist pattern) as an etching mask. By this means, through holes 23 extending from the back side of the semiconductor substrate 11 through the semiconductor substrate 11 in a thickness direction to the integrated circuits are formed in the chip areas 2 (FIGS. 5A, 5B). This etching of the semiconductor substrate 11 is performed using, e.g., the uppermost layer of the circuit layer 12 as an etching stopper.

Figure 5C:
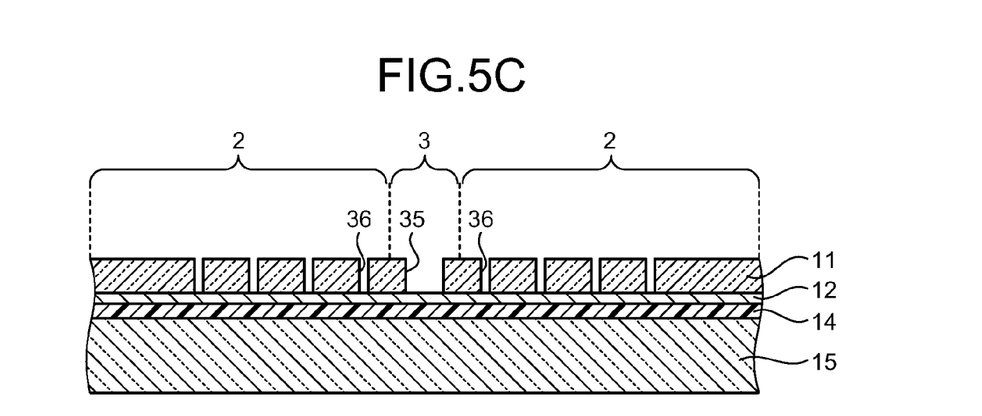

Further, by this etching, a through hole 35 corresponding to the first mark opening 33 and through holes 36 corresponding to the second mark openings 34, which are through holes extending from the back side of the semiconductor substrate 11 through the semiconductor substrate 11 in a thickness direction to the for-test circuit elements 13, are formed in the dicing line 3 (FIGS. 5A, 5C). Then, the inner perimeter surfaces of the through holes 23, 35, and 36 and the back side of the semiconductor substrate 11 are coated with an oxide film, which is omitted from depiction in the figures.

Then, by removing parts of the oxide film at the bottoms of the through holes 23, 35, and 36 by etching, the uppermost layer of the circuit layer 12 is exposed. The inner perimeter surfaces of the through holes 23, 35, and 36 and the back side of the semiconductor substrate 11 are coated with a barrier metal, which is omitted from depiction in the figures. As the barrier metal, for example, a film of titanium nitride or nickel nitride is formed by sputtering. Note that the barrier metal may be of any material other than the above materials as long as it can suppress the diffusion of metal filled in the through holes 23, 35, and 36 to the semiconductor substrate 11 side.

Figure 6A:
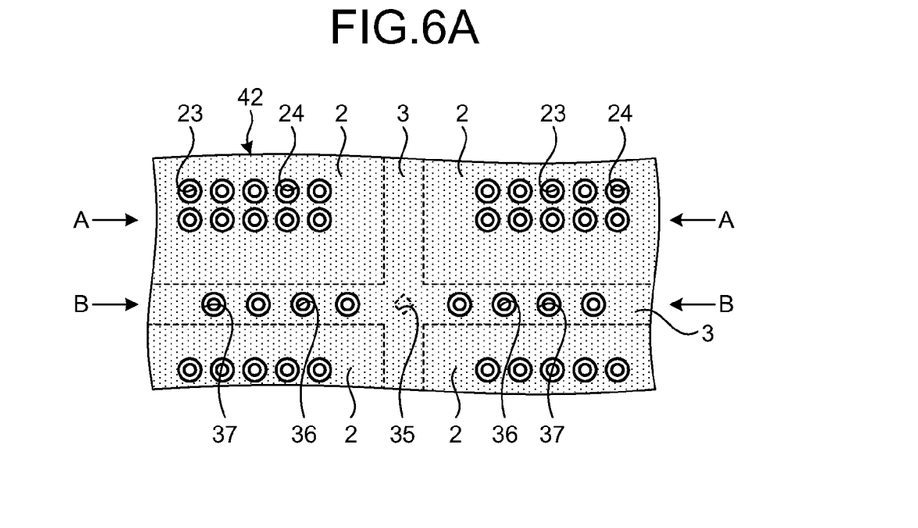
FIGS. 6A to 6C are diagrams showing the manufacturing process of the semiconductor wafer according to the embodiment.
Figure 6B:
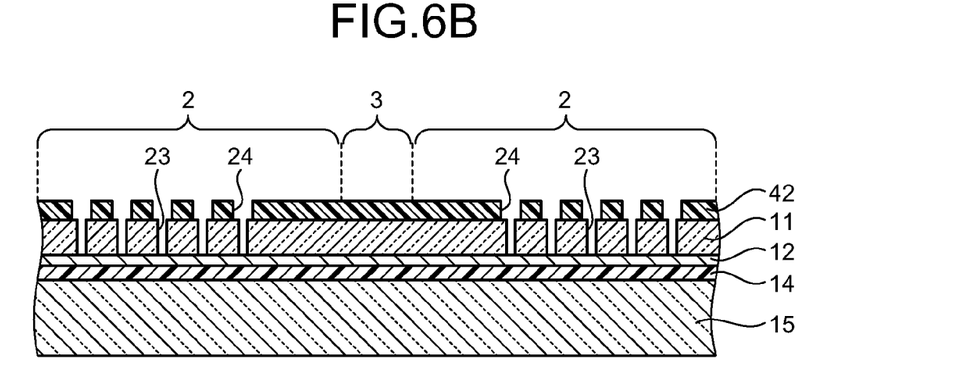

Subsequently, the back side of the semiconductor substrate 11 covered by the barrier metal is coated with a resist 42. Then, openings 24 in, e.g., a circular shape extending through the resist 42 in a thickness direction to the back side of the semiconductor substrate 11 are formed by exposure and development in the resist 42 on the chip areas 2 (FIGS.

6A, 6B). At this time, the resist 42 is patterned such that the openings 24 larger in opening area than the through hole 23 are formed at the opening positions of the through holes 23, on the back side of the semiconductor substrate 11. Thus, a resist pattern having the openings 24, through which regions having the through holes 23 inside along a plane direction of the semiconductor substrate 11 are exposed, is formed.

Figure 6C:
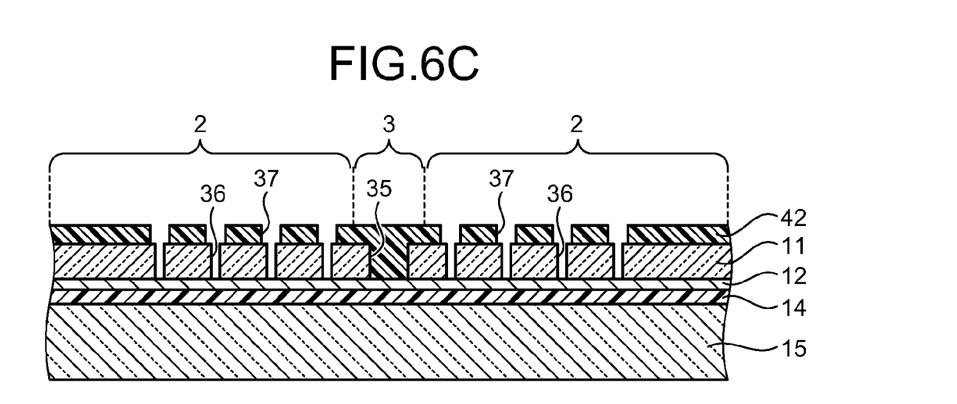

Likewise, for the through holes 36, openings 37 in, e.g., a circular shape extending through the resist 42 in a thickness direction to the back side of the semiconductor substrate 11 are formed in the resist 42 on the dicing line 3 simultaneously with the openings 24 (FIGS. 6A, 6C). At this time, the resist 42 is patterned such that the openings 37 larger in opening area than the through hole 36 are formed at the opening positions of the through holes 36, on the back side of the semiconductor substrate 11. Thus, a resist pattern having the openings 37, through which regions having the through holes 36 inside along a plane direction of the semiconductor substrate 11 are exposed, is formed. The through hole 35 is filled with, and covered by, part of the resist 42.

Alignment in exposure of the resist 42 is performed using the first mark opening 33. Alignment of exposure positions (positions of a photomask) in exposure of the resist 42 is performed based on the position of the first mark opening 33 while observing the first mark opening 33 with a usual microscope not using infrared. As described above, the second mark openings 34 are formed in the neighboring areas of the first mark opening 33. Hence, if the first mark opening 33 itself cannot be directly detected, then by searching the vicinity of the detected second mark openings 34, the first mark opening 33 can be easily detected in a short time.

Figure 7A:
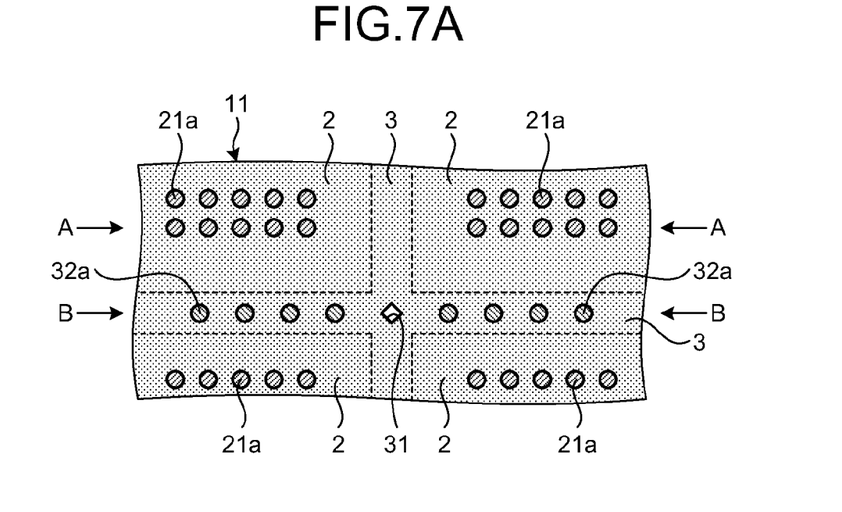
FIGS. 7A to 7C are diagrams showing the manufacturing process of the semiconductor wafer according to the embodiment.
Figure 7B:
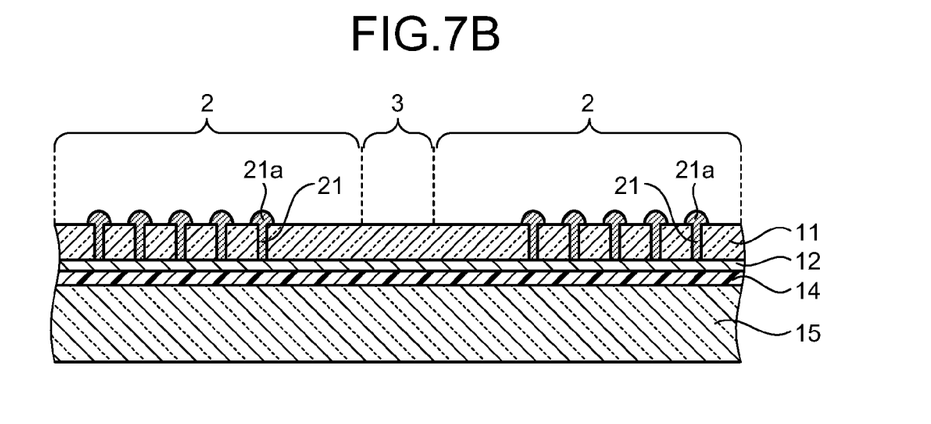
Figure 7C:
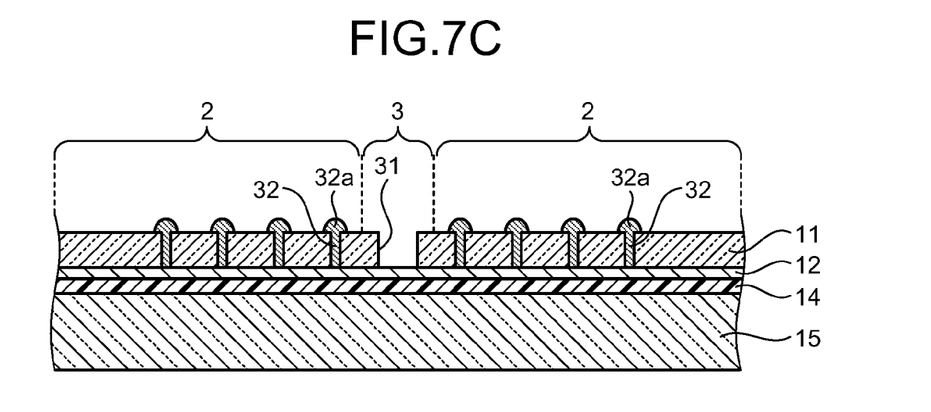

Subsequently, by filling conductive material into the through holes 23 and the openings 24 in the resist 42, the vias 21 connecting to the integrated circuits are formed in the chip areas 2. Further, by filling conductive material into the through holes 36 and the openings 37 in the resist 42, the for-test vias 32 connecting to the for-test circuit elements 13 are formed in the dicing lines 3 simultaneously with the formation of the vias 21. As the conductive material, for example, nickel is used. These vias are formed by, e.g., sputtering or plating. In these vias, the conductive material filled into the openings in the resist 42 becomes the bumps (FIGS. 7A to 7C).

Then, the resist 42 and the barrier metal under the resist 42 are peeled off, and the support substrate 15 and the adhesive layer 14 are removed. Thus, the semiconductor integrated circuit wafer 1 shown in FIGS. 2A to 2C is formed.

The semiconductor integrated circuit wafer 1 is divided according to the chip areas 2 into chips by dicing after an electrical characteristic test is performed. The divided semiconductor chips are stacked and coated with resin or the like to be molded into a product. The separating of the chip areas 2 respectively into chips is performed by cutting the semiconductor integrated circuit wafer 1 along the dicing lines 3. At this time, almost the entire dicing lines 3 disappear. The openings 31 and the for-test vias 32 also disappear.

Figure 9:
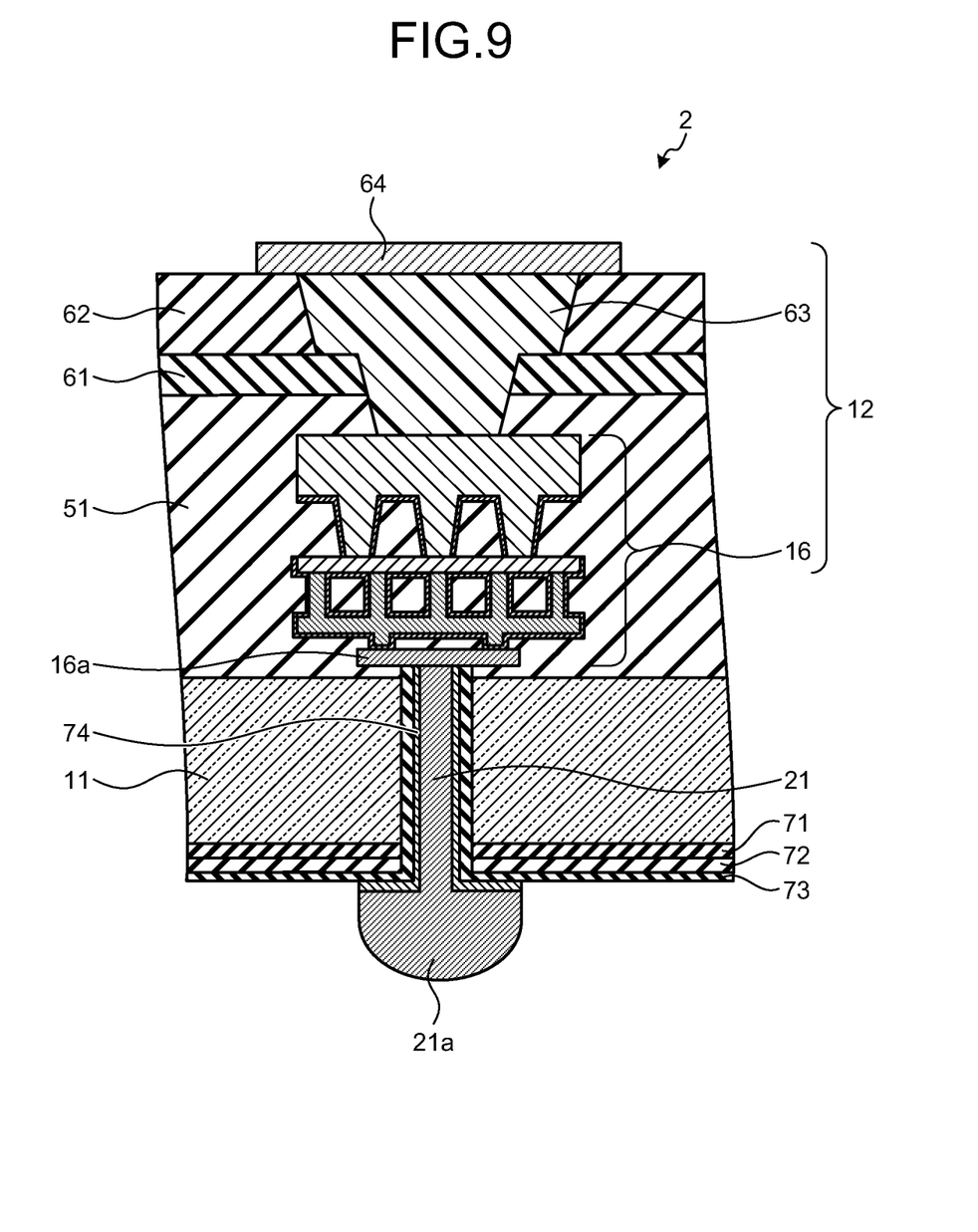
FIG. 9 is a main-part cross-sectional view of a chip area in the semiconductor wafer according to the embodiment.

Next, details of an example configuration of the circuit layer 12 of the chip area 2 will be described. FIG. 9 is a main-part cross-sectional view of the chip area 2 in the semiconductor integrated circuit wafer 1. The chip area 2 comprises an integrated circuit 16 provided on the front side of the semiconductor substrate 11 and the via 21. For example, a silicon wafer or the like is used as the semiconductor substrate 11. The via 21 extends through the semiconductor substrate 11 in a thickness direction and connects to the integrated circuit 16.

The integrated circuit 16 is provided in an interlayer insulating film 51 formed on the front side of the semiconductor substrate 11. The interlayer insulating film 51 is formed of insulating material such as silicon oxide. The integrated circuit 16 is an LSI (Large Scale Integration) including, e.g., a NAND-type semiconductor memory and multilayer wiring. In FIG. 9, the multilayer wiring in the integrated circuit 16 is selectively illustrated.

A passivation film 61 and a protective film 62 are laid one over the other on the surface of the integrated circuit 16. The passivation film 61 is formed of, e.g., silicon oxide or silicon nitride. The protective film 62 is formed of, e.g., resin such as PET (polyethylene terephthalate) or polyimide.

An upper electrode pad 64 is provided at a predetermined position on the surface of the protective film 62. The upper electrode pad 64 is formed of, e.g., gold. The upper electrode pad 64 and the integrated circuit 16 is electrically, physically connected by an upper electrode 63 extending through the protective film 62, the passivation film 61, and part of the interlayer insulating film 51 in a thickness direction of the semiconductor substrate 11. The upper electrode 63 is formed of, e.g., nickel.

For example, a silicon oxide film 71, a silicon nitride film 72, and a silicon oxide film 73 are provided being laid one over the other on the back side of the semiconductor substrate 11. The via 21 is provided extending through these films and the semiconductor substrate 11 in a thickness direction. The exposed end of the via 21 protruding from the back side of the semiconductor substrate 11 is the bump 21a for connecting to the upper electrode pad 64 of the semiconductor chip opposite for conduction when semiconductor chips that the chip areas 2 are separated respectively into are stacked in multiple stages. Barrier metal 74 is provided between the outer surface of the via 21 and the semiconductor substrate 11 and between the exposed end (bump 21a) of the via 21 protruding from the back side of the semiconductor substrate 11 and the silicon oxide film 73.

In the circuit layer 12 on the dicing line 3, the for-test circuit element 13 is provided instead of the integrated circuit 16 in, e.g., FIG. 9, and the for-test via 32 is provided instead of the via 21. The structure around the for-test via 32 and the connecting structure of the for-test via 32 and the for-test circuit elements 13 are the same as in the above case of the via 21.

The for-test via 32 is provided extending through the semiconductor substrate 11 in a thickness direction. The for-test via 32 also has a function as a through silicon via (TSV) electrically connecting the for-test circuit element 13 provided in the semiconductor integrated circuit wafer 1 of the lower stage and the for-test circuit element 13 provided in the semiconductor integrated circuit wafer 1 of the upper stage when a daisy-chain connection of the semiconductor integrated circuit wafers 1 stacked in multiple stages is tested for the electrical characteristics using the for-test circuit elements 13.

Figure 10A:
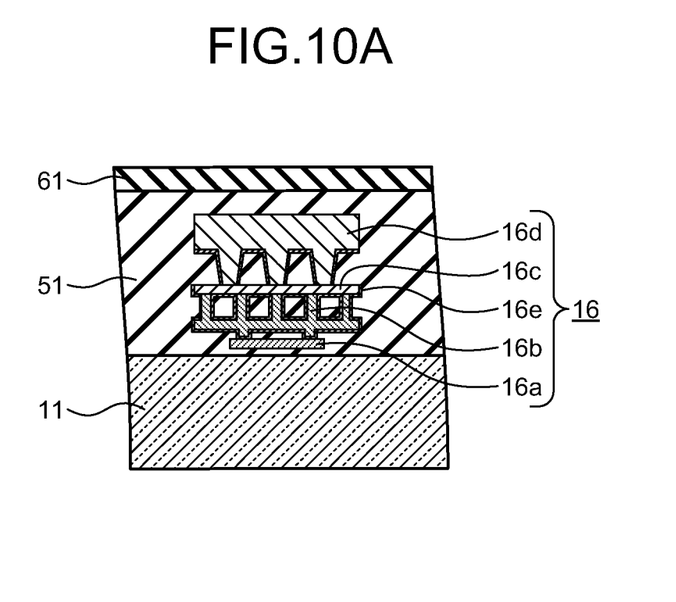
FIGS. 10A and 10B are main-part cross-sectional views for explaining the method of forming a device layer on the chip areas.
Figure 10B:
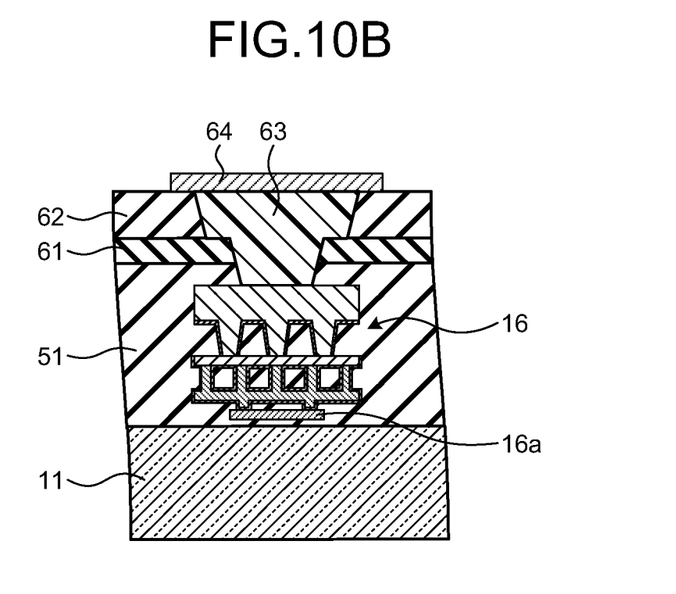

Next, a method of forming the circuit layer 12 will be described. FIGS. 10A and 10B are main-part cross-sectional views for explaining the method of forming the circuit layer 12 on the chip areas 2. An integrated circuit 16 is formed on an area to become the chip area 2 of the front side of the semiconductor substrate 11 (FIG. 10A). For example, in forming the multilayer wiring of the integrated circuit 16, a silicon oxide film is formed on the surface of the semiconductor substrate 11, and a recess is formed in the silicon oxide film to form a contact portion 16a by photolithography and etching, and polysilicon is filled into the recess. Then, a nickel layer is formed over the polysilicon to become nickel silicide through the heating process so as to form contact portion 16a.

The material of the contact portion 16a is not limited to nickel silicide, but may be any metal such as tungsten or any metal silicide as long as it functions as an etching stopper when etching the semiconductor substrate 11 as above.

Then, the process of forming a silicon oxide film, the process of patterning the silicon oxide film by photolithography and etching, and the process of coating recesses in a wiring pattern formed by patterning with barrier metal and filling them with conductive material are sequentially repeated.

Thus, first, second, and third wiring layers 16b, 16c, 16d whose interfaces with the interlayer insulating film 51 are coated with barrier metal 16e are formed in the interlayer insulating film 51. By executing these processes, the integrated circuit 16 is formed in the chip area 2. Also, by executing these processes, the for-test circuit element 13 is formed in the circuit layer 12 on the dicing line 3 by the same process as, and simultaneously with, the integrated circuit 16.

For the first wiring layer 16b, e.g., tungsten is used. For the second wiring layer 16c, e.g., copper is used. For the third wiring layer 16d, e.g., aluminum is used. Note that for the first, second, and third wiring layers 16b, 16c, 16d, conductive materials other than the above metals may be used.

For the barrier metal 16e, e.g., titanium nitride or nickel nitride is used. Note that for the barrier metal 16e, any material other than the above materials may be used as long as it can suppress the diffusion of conductive material from the first, second, and third wiring layers 16b, 16c, 16d into the interlayer insulating film 51.

At any timing while the integrated circuit 16 is being formed, a plurality of the alignment marks 11a mentioned previously (not shown) are formed in the semiconductor substrate 11. Then, the passivation film 61 made of, e.g., silicon oxide or silicon nitride is formed on the upper surface of the interlayer insulating film 51.

Subsequently, the protective film 62 made of, e.g., resin such as PET or polyimide is formed on the upper surface of the passivation film 61. Then, through holes are formed in the chip area 2 and the dicing line 3 by the same process. That is, a through hole extending through the protective film 62, the passivation film 61, and part of the interlayer insulating film 51 to the integrated circuit 16 is formed on the chip area 2. Further, a through hole extending through the protective film 62, the passivation film 61, and the interlayer insulating film 51 to the for-test circuit element 13 is formed in the dicing line 3.

Next, for example, nickel is filled into the through holes, thereby forming the upper electrode 63. For the upper electrode 63, a metal other than nickel may be used as long as it is a conductive material.

Then, the upper electrode pad 64 made of, e.g., gold is formed on the upper exposed surface of the upper electrode 63 (FIG. 10B). For the upper electrode pad 64, a metal other than gold may be used as long as it is a conductive material. Having undergone the above processes, the semiconductor substrate 11 having the circuit layer 12 formed thereon is obtained.

Figure 11:
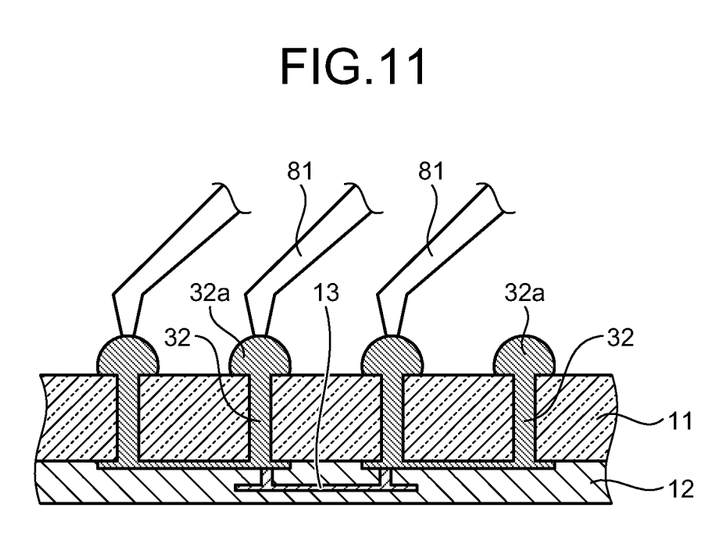
FIG. 11 is a schematic diagram for explaining the method of an electrical characteristic test according to the embodiment.

Next, the electrical characteristic test of indirectly inspecting the electrical characteristics of the integrated circuit formed on the chip area 2 and the electrical characteristics of the TSVs will be described. The electrical characteristic test is a test for indirectly inspecting the performance of the integrated circuit and the TSVs. The electrical characteristic test is performed with for-test probes 81 being connected to the bumps 32a of for-test vias 32 using a device called a prober as shown in, e.g., FIG. 11. FIG. 11 is a schematic diagram for explaining the method of the electrical characteristic test.

When the TSVs connecting to the integrated circuit are formed in the chip area 2, the semiconductor substrate 11 is made thin enough to be able to form through holes. In order to deal with the semiconductor substrate 11 made thin in the manufacturing process, the support substrate 15 is stuck to the front side of the semiconductor substrate 11 via the adhesive layer 14. Thus, the electrical characteristic test cannot be performed from the front side of the semiconductor substrate 11.

In the manufacture of, e.g., a semiconductor memory such as a NAND-type memory, in order to secure the gross quantity, the TEG area is accommodated in dicing lines. Also in the case of a NAND-type semiconductor memory having TSVs, it is desired to accommodate the TEG area in dicing lines. However, if for-TEG electrode pads are provided in dicing lines, the TEG pattern cannot be accommodated in dicing lines.

In contrast, in the semiconductor integrated circuit wafer 1 according to the embodiment, the for-test circuit element 13 is formed in a dicing line 3 at the front side of the semiconductor substrate 11. The for-test vias 32 that are TSVs connecting to the for-test circuit element 13 are made to lead out to the back side of the semiconductor substrate 11. The for-test vias 32 have the exposed bumps 32a protruding from the back side of the semiconductor substrate 11. The for-test vias 32 are formed using the second mark openings 34 that are lead marks for the first mark opening 33 as described previously. Thus, in the semiconductor integrated circuit wafer 1, members necessary for the electrical characteristic test are accommodated in dicing lines 3. Also, the electrical characteristic test can be performed from the back side of the semiconductor integrated circuit wafer 1. Thus, with the semiconductor integrated circuit wafer 1, the gross quantity can be secured, not reduced, and the evaluation of the electrical characteristics of the integrated circuit and the electrical characteristics of the TSVs can be performed from the back side.

By forming the upper electrode 63 and the upper electrode pad 64 connecting to the for-test circuit element 13 in the same way as for the integrated circuit 16, with the semiconductor integrated circuit wafers 1 being stacked in multiple stages, a daisy-chain connection of the for-test circuit elements 13 can be tested for the electrical characteristics.

Further, where the semiconductor integrated circuit wafers 1 not diced are in circulation for use, the electrical characteristic test can be performed thereon using the for-test vias 32 at an arbitrary timing.

According to the embodiment, the second mark openings 34 are formed in the neighboring areas of the first mark opening 33. As a result, by searching the vicinity of the detected second mark openings 34, the first mark opening 33 can be easily detected in a short time, and the effect that the workability of the exposure process can be improved is obtained.

Further, according to the embodiment, the for-test circuit elements 13 are formed in dicing lines 3 at the front side of the semiconductor substrate 11. The for-test vias 32 connecting to the for-test circuit elements 13 are made to lead out to the back side of the semiconductor substrate 11 in dicing lines 3. As a result, the gross quantity is secured, not reduced, and the effect of realizing the semiconductor integrated circuit wafer 1 wherein the evaluation of the electrical characteristics of the integrated circuit and the electrical characteristics of the TSVs can be performed from the back side, can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit wafer, comprising:
    multiple chip areas having integrated circuits provided on one side of a semiconductor substrate;
    dicing lines separating the multiple chip areas from each other in the semiconductor substrate;
    a TEG provided in the dicing lines at the one side of the semiconductor substrate;
    first through vias exposed at a back side of the semiconductor substrate in the dicing lines and leading from the back side of the semiconductor substrate through the semiconductor substrate in a thickness direction to the TEG;
    second through vias exposed at the back side of the semiconductor substrate in the chip areas and leading from the back side of the semiconductor substrate through the semiconductor substrate in the thickness direction to the integrated circuits; and
    a circuit pattern for indirectly inspecting electrical characteristics of the second through vias provided in the TEG.

2. The semiconductor integrated circuit wafer according to claim 1, wherein a circuit pattern for indirectly inspecting electrical characteristics of the integrated circuits is provided in the TEG.

3. The semiconductor integrated circuit wafer according to claim 1, wherein the first through vias are formed in a central region along a width direction of the dicing lines.

4. The semiconductor integrated circuit wafer according to claim 1, wherein each of the first through vias comprises a bump on a surface on the back side of the semiconductor substrate.

5. A semiconductor integrated circuit wafer, comprising:
    multiple chip areas having integrated circuits provided on one side of a semiconductor substrate;
    dicing lines separating the multiple chip areas from each other in the semiconductor substrate;
    a first mark provided in the dicing lines; and
    second marks provided in the dicing lines as through vias, the through vias being exposed at a back side of the semiconductor substrate in the dicing lines and leading from the back side of the semiconductor substrate through the semiconductor substrate in a thickness direction,
    wherein the second marks are different from the first mark in at least one of shape and size along a plane direction of the semiconductor substrate.

6. The semiconductor integrated circuit wafer according to claim 5, wherein the second marks are formed at predetermined pitches.

7. The semiconductor integrated circuit wafer according to claim 5, wherein the second marks are formed in two opposite regions of the dicing lines with the first mark in between.

8. The semiconductor integrated circuit wafer according to claim 7, wherein a plurality of the second marks are formed in each of the two opposite regions with the first mark in between.

9. The semiconductor integrated circuit wafer according to claim 7, wherein a plurality of the second marks are formed in each of the two opposite regions with the first mark in between at different pitches for the two regions.

10. The semiconductor integrated circuit wafer according to claim 5, wherein the first mark is formed in an intersection region where two of the dicing lines intersect along a plane direction of the semiconductor substrate.

11. The semiconductor integrated circuit wafer according to claim 10, wherein the second marks are formed in the dicing lines of four directions going out from the intersection region as a center.

12. The semiconductor integrated circuit wafer according to claim 5, wherein the second marks are formed in a central region along a width direction of the dicing lines.

* * * * *